(12) United States Patent
Ye

(10) Patent No.: US 10,528,168 B2
(45) Date of Patent: Jan. 7, 2020

(54) OLED TOUCH DISPLAY PANEL AND MANUFACTURING METHOD THEREOF

(71) Applicant: Wuhan China Star Optoelectronics Semiconductor Display Technology Co., Ltd., Wuhan (CN)

(72) Inventor: Jian Ye, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 15/763,840

(22) PCT Filed: Jan. 5, 2018

(86) PCT No.: PCT/CN2018/071498
§ 371 (c)(1),
(2) Date: Mar. 28, 2018

(87) PCT Pub. No.: WO2019/114063
PCT Pub. Date: Jun. 20, 2019

(65) Prior Publication Data
US 2019/0187844 A1   Jun. 20, 2019

(30) Foreign Application Priority Data
Dec. 14, 2017 (CN) .......................... 2017 1 1341995

(51) Int. Cl.
*G06F 3/041* (2006.01)
*H01L 27/32* (2006.01)
(Continued)

(52) U.S. Cl.
CPC ............ *G06F 3/0412* (2013.01); *G06F 3/044* (2013.01); *G06F 3/0416* (2013.01);
(Continued)

(58) Field of Classification Search
CPC ...... G06F 3/0412; G06F 3/0416; G06F 3/044; H01L 27/323; H01L 27/3244;
(Continued)

(56) References Cited

U.S. PATENT DOCUMENTS 6,818,329 B1 * 11/2004 Liao ................... H01L 51/5048
313/504
6,897,474 B2 * 5/2005 Brown ............... H01L 51/5246
257/40
(Continued)

FOREIGN PATENT DOCUMENTS

CN   105702205   6/2016
CN   106354339   1/2017
(Continued)

*Primary Examiner* — Fred Tzeng

(57) ABSTRACT

The present invention provides an OLED touch display panel including an array substrate, an organic light-emitting layer; and a cathode metal layer patterned to form first touch signal lines arranged parallel to and spaced from each other. The OLED touch display panel further including an encapsulation layer; a circular polarizer plate; second touch signal lines disposed in or at a side of the circular polarizer plate; and the first touch signal lines and the second touch signal lines formed a touch panel.

8 Claims, 3 Drawing Sheets

(51) Int. Cl.
*H01L 51/00* (2006.01)
*H01L 51/52* (2006.01)
*H01L 51/56* (2006.01)
*G06F 3/044* (2006.01)

(52) U.S. Cl.
CPC ........ *H01L 27/323* (2013.01); *H01L 27/3244* (2013.01); *H01L 51/0097* (2013.01); *H01L 51/5253* (2013.01); *H01L 51/5281* (2013.01); *H01L 51/56* (2013.01); *G06F 2203/04103* (2013.01); *H01L 2227/323* (2013.01); *H01L 2251/5338* (2013.01)

(58) Field of Classification Search
CPC ............. H01L 27/3248; H01L 27/3258; H01L 51/0097; H01L 51/5253; H01L 51/5281; H01L 51/56; H01L 51/5012; H01L 51/5243
USPC .......................................................... 345/174
See application file for complete search history.

(56) References Cited

U.S. PATENT DOCUMENTS

| | | | | |
|---|---|---|---|---|
| 9,450,210 B2* | 9/2016 | Gao | .................. | G02B 5/3033 |
| 9,551,063 B2* | 1/2017 | Yamazaki | | |
| 9,893,310 B2* | 2/2018 | Qian | .................. | H01L 51/56 |
| 10,121,832 B1* | 11/2018 | Wu | ....................... | H01L 27/323 |
| 10,283,729 B2* | 5/2019 | Zhang | ................ | H01L 27/3248 |
| 2003/0162314 A1* | 8/2003 | Yamazaki | ............... | C23C 14/12 |
| | | | | 438/46 |
| 2003/0183830 A1* | 10/2003 | Yamazaki | ........... | H01L 27/3258 |
| | | | | 257/90 |
| 2004/0251823 A1* | 12/2004 | Park | .................... | H01L 51/5281 |
| | | | | 313/506 |
| 2005/0001543 A1* | 1/2005 | Nomura | .............. | H01L 51/0012 |
| | | | | 313/504 |
| 2005/0233166 A1* | 10/2005 | Ricks | .................. | H01L 51/5036 |
| | | | | 428/690 |
| 2014/0231788 A1* | 8/2014 | Krall | ................... | H01L 27/3239 |
| | | | | 257/40 |
| 2016/0118454 A1* | 4/2016 | Park | .................... | H01L 51/5243 |
| | | | | 257/40 |
| 2016/0248037 A1* | 8/2016 | Liu | ........................ | H01L 51/56 |
| 2016/0306479 A1* | 10/2016 | Zhu | ........................ | G06F 3/044 |
| 2016/0351631 A1* | 12/2016 | Lee | ........................ | G06F 3/0412 |
| 2017/0069692 A1* | 3/2017 | Lee | ........................ | H01L 27/323 |
| 2017/0207279 A1* | 7/2017 | Zeng | .................... | H01L 27/323 |
| 2017/0278902 A1* | 9/2017 | Choi | ....................... | G02B 1/08 |
| 2017/0301736 A1* | 10/2017 | Wang | .................... | G06F 3/0412 |
| 2017/0301880 A1* | 10/2017 | Pei | ........................ | H01L 51/52 |
| 2018/0122890 A1* | 5/2018 | Park | .................... | H01L 27/3248 |
| 2018/0212179 A1* | 7/2018 | Yu | ....................... | H01L 51/5012 |
| 2018/0260047 A1* | 9/2018 | Wang | .................... | G06F 3/0416 |
| 2018/0284505 A1* | 10/2018 | Ye | ........................ | G02F 1/1343 |
| 2019/0044078 A1* | 2/2019 | Chen | .................. | H01L 51/0097 |
| 2019/0051707 A1* | 2/2019 | Li | ........................ | H01L 27/323 |

FOREIGN PATENT DOCUMENTS

| | | |
|---|---|---|
| CN | 106406628 | 2/2017 |
| CN | 106449712 | 2/2017 |
| CN | 106775062 | 5/2017 |
| CN | 106843621 | 6/2017 |

* cited by examiner

OLED TOUCH DISPLAY PANEL AND MANUFACTURING METHOD THEREOF

RELATED APPLICATIONS

This application is a National Phase of PCT Patent Application No. PCT/CN2018/071498 having International filing date of Jan. 5, 2018, which claims the benefit of Chinese Patent Application No. 201711341995.8 filed on Dec. 14, 2017. The contents of the above applications are all incorporated by reference as if fully set forth herein in their entirety.

FIELD AND BACKGROUND OF THE INVENTION

The present invention relates to the field of display technologies, and in particular to an OLED touch display panel and a manufacturing method thereof.

Organic light-emitting diodes (OLEDs) are self-luminous, have fast response times, wide viewing angles, and other characteristics, which makes wide application prospects. Nowadays, bendable displays are mainstream. As development of flexible OLED display technologies rapidly develop, touch panels are required to be compatible with flexible and bendable. Conventional material of touch panels are based on indium tin oxide (ITO) material, but this kind of material has not met flexible touch requirements.

Conventional touch panels need to be manufacture separately and then bonded to a surface of an OLED display panel through optical transparent glue, to form a complete touch display module. Therefore, the process increases a bonding process, and also increases thickness of the entire OLED display device, resulting in that the flexibility, lightening, and thinning of OLED display devices are hard to achieve.

In view of the above, a touch panel of an OLED display panel according to the present technologies needs to be additionally attached to a surface of the OLED display panel, thus increase a thickness of an OLED display device, resulting in that the flexibility, lightening and thinning of OLED display devices are hard to achieve.

SUMMARY OF THE INVENTION

The present invention is to provide an OLED touch display panel capable of forming a touch electrode on a surface of an internal film layer of an OLED display panel, so as to solve the conventional technological problem: a touch panel of an OLED display panel needs to be additionally attached to a surface of the OLED display panel, thus increase a thickness of the OLED display device, result in that the flexibility, lightening and thinning of OLED display devices are hard to achieve.

In order to solve the above technical problem, the technical solution provided by the present invention is as follows:

The present invention provides an OLED touch display panel, comprising: an array substrate; an organic light-emitting layer disposed on the array substrate; a cathode metal layer disposed on the organic light-emitting layer, wherein the cathode metal layer is patterned to form first touch signal lines arranged parallel to and spaced from each other; an encapsulation layer disposed on the cathode metal layer; and a circular polarizer plate disposed on the encapsulation layer, wherein second touch signal lines are disposed in or at a side of the circular polarizer plate, the second touch signal lines are arranged parallel to and spaced from each other, and the first touch signal lines and the second touch signal lines are perpendicular to each other and formed on different surfaces, to thus form a touch panel.

According to a preferred embodiment of the present invention, the first touch signal lines are driving electrode lines, and the second touch signal lines are sensing electrode signal lines; and wherein the driving electrode lines are made of indium tin oxide material, the sensing electrode signal lines are formed by a conductive filament made of a metal material or carbon nanotubes, and the metal material is selected from a group consisting of gold, silver, copper, aluminum, titanium and molybdenum.

According to a preferred embodiment of the present invention, the circular polarizer plate comprises: a first optical adhesive layer configured to achieve bonding between the circular polarizer plate and the encapsulation layer; a quarter phase film disposed on the first optical adhesive layer; a second optical adhesive layer disposed on the quarter phase film; a first transparent substrate disposed on the second optical adhesive layer; a polarizing film disposed on the first transparent substrate; and a second transparent substrate disposed on the polarizing film.

According to a preferred embodiment of the present invention, the sensing electrode signal lines are disposed on a side of the second transparent substrate away from the polarizing film.

According to a preferred embodiment of the present invention, the sensing electrode signal lines are disposed on a side of the quarter phase film away from the second optical adhesive layer.

According to a preferred embodiment of the present invention, the sensing electrode signal lines are disposed on a side of the quarter phase film away from the first optical adhesive layer.

The present invention further provides an OLED touch display panel, comprising: an array substrate; an organic light-emitting layer disposed on the array substrate; a cathode metal layer disposed on the organic light-emitting layer; an encapsulation layer disposed on the cathode metal layer; a circular polarizer plate disposed on the encapsulation layer; first touch signal lines; and second touch signal lines, wherein the first touch signal lines are disposed on the encapsulation layer, and the second touch signal lines are disposed on the first touch signal lines; or wherein the first touch signal lines are disposed on the encapsulation layer, and the second touch signal lines are disposed in or at a side of the circular polarizer plate; or wherein the first touch signal lines are disposed on one side of the circular polarizer plate, and the second touch signal lines are disposed on the other side of the circular polarizer plate or disposed on the first touch signal line.

According to a preferred embodiment of the present invention, the circular polarizer plate comprises: a first optical adhesive layer configured to achieve bonding between the circular polarizer plate and the encapsulation layer; a quarter phase film disposed on the first optical adhesive layer; a second optical adhesive layer disposed on the quarter phase film; a first transparent substrate disposed on the second optical adhesive layer; a polarizing film disposed on the first transparent substrate; and a second transparent substrate disposed on the polarizing film.

According to a preferred embodiment of the present invention, the first touch signal lines are driving electrode lines, and the second touch signal lines are sensing electrode signal lines; and wherein the driving electrode lines are made of indium tin oxide material, the sensing electrode signal lines are formed by a conductive filament made of a metal material or carbon nanotubes, and the metal material is selected from a group consisting of gold, silver, copper, aluminum, titanium and molybdenum.

According to the above object of the present invention is to provide a method for manufacturing an OLED touch display panel, comprising: a step S10 of providing a flexible substrate; a step S20 of forming a thin film transistor device layer on the flexible substrate; a step S30 of forming an anode metal layer on the thin film transistor device layer; a step S40 of forming an organic light-emitting layer on the anode metal layer; a step S50 of forming a cathode metal layer on the organic light-emitting layer, and then patterning the cathode metal layer to form a driving electrode lines arranged parallel to and spaced from each other; a step S60 of forming an encapsulation layer on the organic light-emitting layer; a step S70 of providing a circular polarizer plate, wherein sensing electrode lines are disposed in or at a side of the circular polarizer plate, and the second touch signal lines are arranged parallel to and spaced from each other; and a step S80 of disposing the circular polarizer plate on the encapsulation layer.

Compared with conventional OLED touch display panels, the present invention has the advantages of the present invention provides an OLED touch display panel in which a touch electrode is formed on a functional film layer of an OLED display panel, and a cathode metal of an OLED display panel is simultaneously used as a driving electrode of the touch panel, so as to reduces a thickness of the OLED display panel and facilitate to achieve the flexibility, lightening and thinning of OLED display panel, so as to solve conventional technological problems being that a touch panel of an OLED display panel needs to be additionally attached to a surface of the OLED display panel, thus increasing thickness of the OLED display device, resulting in that the flexibility, lightening and thinning of OLED display devices are hard to achieve.

BRIEF DESCRIPTION OF THE SEVERAL VIEWS OF THE DRAWINGS

In order to more clearly illustrate the technical solutions in the embodiments or the prior art embodiment of the present invention, the accompanying drawings, briefly described embodiments, or the prior art need to be used in describing the embodiments. The drawings and the following description are only some embodiments of the present disclosure. Those of ordinary skill in the art may, without creative efforts, derive from these drawings other drawings.

DETAILED DESCRIPTION OF PREFERRED SPECIFIC EMBODIMENTS OF THE INVENTION

The structure and the technical means adopted by the present invention to achieve the above and other objects may be best understood by referring to the following detailed description of the preferred embodiments and the accompanying drawings. Furthermore, directional terms described by the present invention, such as upper, lower, front, back, left, right, inner, outer, side, longitudinal/vertical, transverse/horizontal, etc., are only directions by referring to the accompanying drawings, and thus the used directional terms are used to describe and understand the present invention, but the present invention is not limited thereto.

The present invention is directed against the conventional technological problem: a touch panel of an OLED display panel needs to be additionally attached to a surface of the OLED display panel, thus increase a thickness of the OLED display device, result in that the flexibility, lightening and thinning of OLED display devices are hard to achieve. The embodiments according to the present invention can solve the above mentioned drawback.

Embodiment I

Figure 1:
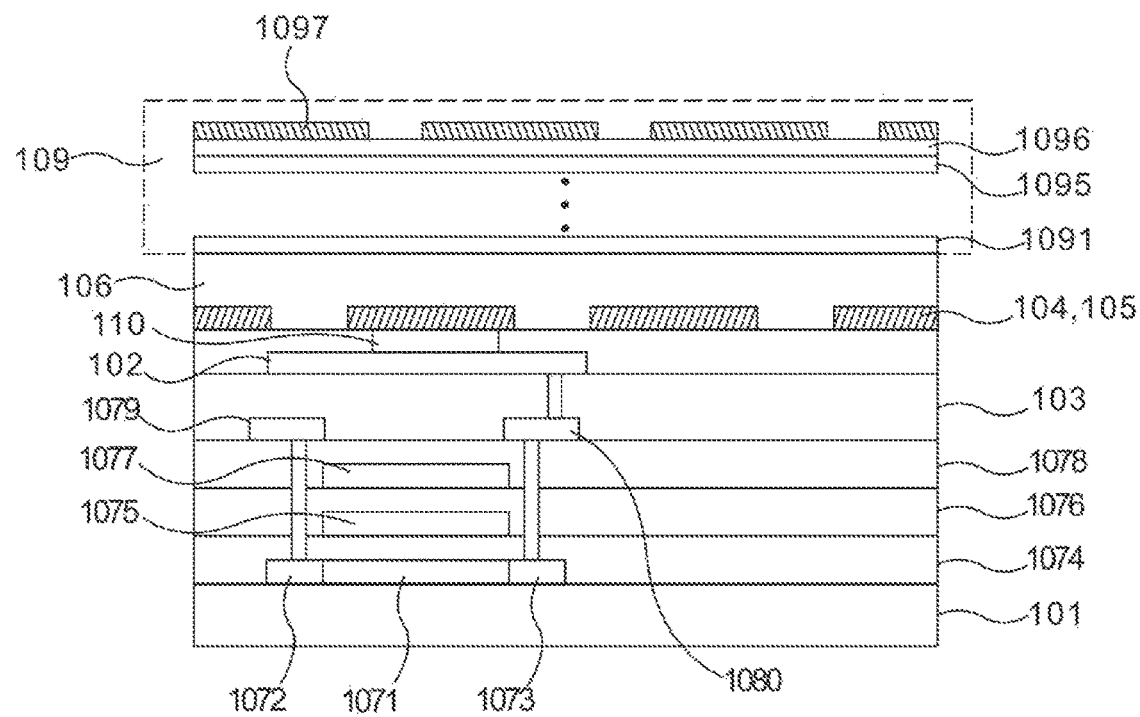
FIG. 1 is a schematic view of a film structure of an OLED touch display panel according to the present invention.

Referring now to FIG. 1, the present invention provides an OLED touch display panel, which includes a flexible substrate 101; a thin film transistor (TFT) device layer formed on the flexible substrate 101, the TFT device layer having TFT devices arranged in an array; a flat layer 103 formed on the TFT device; an OLED device layer formed on the flat layer 103, and the OLED device layer having OLED devices distributed in an array. The OLED devices at least include an anode metal layer 102 formed on the flat layer 103 and connected to the corresponding TFT devices; and an organic light-emitting layer 110 formed on the anode metal layer 102.

A cathode metal layer 104 is formed on the OLED device layer. The cathode metal layer 104 is patterned, to form at least three driving electrode lines 105 arranged parallel to and spaced from each other. The driving electrode lines 105 are located on the corresponding organic light-emitting layer 110.

An encapsulation layer 106 is formed on the OLED device layer to prevent moisture from entering the OLED devices.

A circular polarizer plate 109 is disposed on the encapsulation layer 106. At least three sensing electrode lines are disposed in or at a side of the circular polarizer plate 109, the at least three sensing electrode lines are arranged parallel to and spaced from each other. The sensing electrode lines and the driving electrode lines are perpendicular to each other and formed on different surfaces, to thus form a touch panel.

The cathode metal layer 104 supplies a constant current when acts as a display function, and the cathode metal layer 104 provides electrons to the OLED device. The anode metal layer 102 provides electron holes for the OLED device. The electrons and the electron holes are combined at the organic light-emitting layer 110, thus the organic light-emitting layer 110 emits light. When configured to a touch function, a capacitance is formed between the driving electrode lines 105 formed by the cathode metal layer 104 and the sensing electrode. When a conductor touches a surface of the OLED display panel, a capacitance value between the driving electrode line 105 and the sensing electrode is changed, and the variation value is transmitted to a touch-panel controller chip by the touch signal line, and the touch-panel controller chip determines the touch point coordinates, and then achieves the touch operation.

For example, the TFT devices include an active layer disposed on the flexible substrate 101; the active layer includes a channel region 1071; a source doped region 1072 disposed at one end of the channel region 1071; a drain doped region 1073 disposed at the opposite end of the channel region 1071; a first insulating layer 1074 disposed on the active layer; a first gate metal 1075 disposed on the first insulating layer 1074; a second insulating layer 1076 disposed on the first insulating layer 1074; a second gate metal 1077 disposed on the second insulating layer 1076; a third insulating layer 1078 disposed on the second insulating layer 1076; a source metal 1079 connected to the source doped region 1072 of the active layer; and a drain metal 1080 connected to the drain doped region 1073 of the active layer, wherein The anode metal layer 102 is connected to the drain metal 1080 by a metal through hole.

The circular polarizer plate 109 includes a first optical adhesive layer 1091 configured to achieve bonding between the circular polarizer plate 109 and the encapsulation layer 106; a quarter phase film disposed on the first optical adhesive layer 1091; a second optical adhesive layer disposed on the quarter phase film; a first transparent substrate disposed on the second optical adhesive layer; a polarizing film 1095 disposed on the first transparent substrate; a second transparent substrate 1096 disposed on the polarizing film 1095; and a sensing electrode layer patterned to form the sensing electrode lines 1097 parallel to and spaced from each other.

For example, the sensing electrode lines 1097 is disposed on a side of the second transparent substrate 1096 away from the polarizing film 1095.

The sensing electrode layer is a nano-filament conductive layer, the nano-filament conductive layer includes a transparent photosensitive resin substrate. Nano-filaments are uniformly distributed on a surface of the transparent photosensitive resin substrate, the nano-filaments are staggered and overlap each other so that a surface of the nano-filament conductive layer is uniformly conductive, and a surface of the conductive layer is homogeneous conducting. The conductive filaments may be made of a metal material or carbon nanotubes, and the metal material is selected from a group consisting of gold, silver, copper, aluminum, titanium and molybdenum. Usually, the conductive filaments are selected from a group consisting of silver nano-filaments, the silver nano-filaments have a diameter which is 10 nm to 1000 nm, a length is 0.1 um to 100 um, and the diameter of the silver nano-filaments is smaller than a visual width of human eye, so as to ensure that the sensing electrode layer has high transparency.

During the process of patterning the nano-filament layer, the transparent photosensitive resin containing the conductive filaments are attached to a surface of a target substrate by slit coating or spin coating, for example, the target substrate is the quarter phase film of the circular polarizer plate 109, then the transparent photosensitive resin is semi-cured to form a transparent photosensitive resin layer. After that, the transparent photosensitive resin layer is exposed by using a photomask. Next, a developer solution is applied to a surface of the transparent photosensitive resin layer to form a sensing electrode pattern. Finally, the sensing electrode pattern is cured to form the sensing electrode lines 1097.

Figure 2:
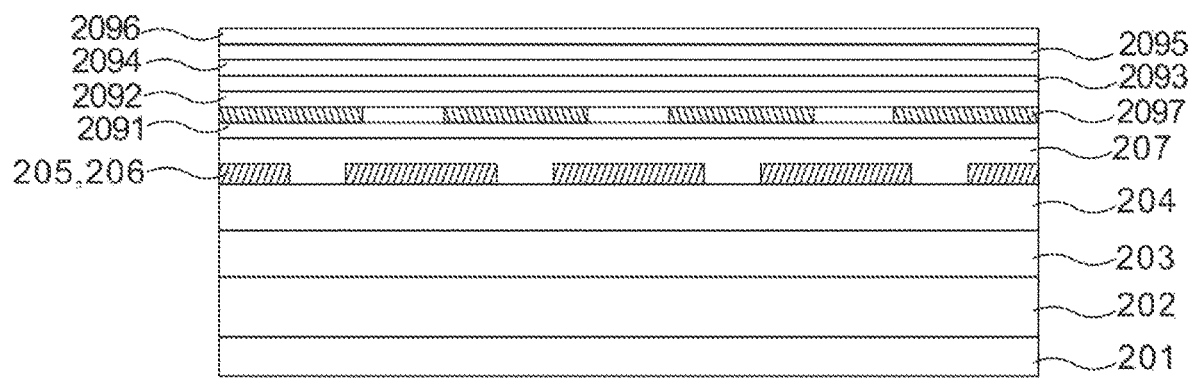
FIG. 2 is a schematic view of another film structure of the OLED touch display panel according to the present invention.

Referring now to FIG. 2, an OLED touch display panel according to the present invention includes a flexible substrate 201; a TFT device layer 202; a flat layer 203; an OLED device layer 204; and a cathode metal layer 205 formed on the OLED device layer 204, the cathode metal layer 205 patterned to form driving electrode lines 206 arranged parallel to and spaced from each other.

An encapsulation layer 207 is formed on the OLED device layer 204. A circular polarizer plate is disposed on the encapsulation layer 207. The circular polarizer plate includes: a first optical adhesive layer 2091 configured to achieve bonding between the circular polarizer plate and the encapsulation layer 207; a quarter phase film 2092 disposed on the first optical adhesive layer 2091; a second optical adhesive layer 2093 disposed on the quarter phase film 2092; a first transparent substrate 2094 disposed on the second optical adhesive layer 2093; a polarizing film 2095 disposed on the first transparent substrate 2094; a second transparent substrate 2096 disposed on the polarizing film 2095; and a sensing electrode layer patterned to form sensing electrode lines 2097 arranged parallel to and spaced from each other.

The difference between FIG. 2 and FIG. 1 is that the sensing electrode lines 2097 are disposed on a side of the quarter phase film 2092 away from the second optical adhesive layer 2093.

Figure 3:
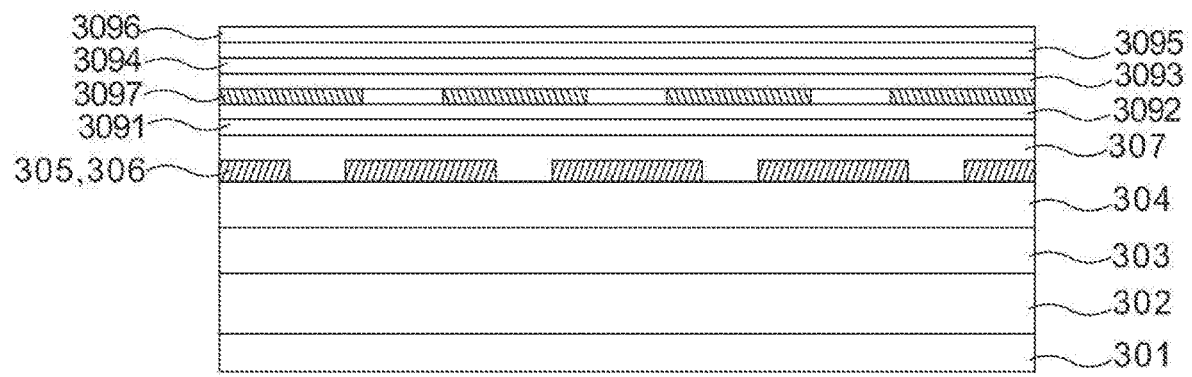
FIG. 3 is a schematic view of yet another film structure of the OLED touch display panel according to the present invention.

Referring now to FIG. 3, an OLED touch display panel according to the present invention includes a flexible substrate 301; a TFT device layer 302; a flat layer 303; an OLED device layer 304; and a cathode metal layer 305 formed on the OLED device layer 304, the cathode metal layer 305 patterned to form driving electrode lines 306 arranged parallel to and spaced from each other.

An encapsulation layer 307 is formed on the OLED device layer 304. A circular polarizer plate is disposed on the encapsulation layer 307. The circular polarizer plate includes: a first optical adhesive layer 3091 configured to achieve bonding between the circular polarizer plate and the encapsulation layer 307; a quarter phase film 3092 disposed on the first optical adhesive layer 3091; a second optical adhesive layer 3093 disposed on the quarter phase film 3092; a first transparent substrate 3094 disposed on the second optical adhesive layer 3093; a polarizing film 3095 disposed on the first transparent substrate 3094; a second transparent substrate 3096 disposed on the polarizing film 3095; and a sensing electrode layer patterned to form sensing electrode lines 3097 arranged parallel to and spaced from each other.

The difference between FIG. 3 and FIG. 1 is that the sensing electrode lines 3097 are disposed on a side of the quarter phase film 3092 away from the first optical adhesive layer 3091.

Embodiment II

Figure 4:
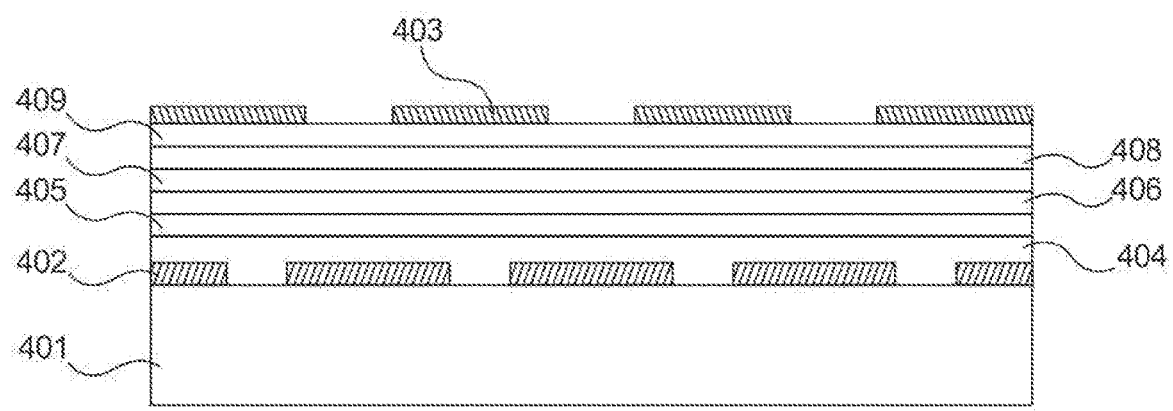
FIG. 4 is a schematic view of further another film structure of the OLED touch display panel according to the present invention.

Referring now to FIG. 4, an OLED touch display panel according to the present invention includes a flexible substrate; a TFT device layer disposed on the flexible substrate. The TFT device layer includes TFT devices arranged in an array; an anode metal layer disposed on the TFT device layer and connecting the corresponding TFT devices; an organic light emitting layer disposed on the anode metal layer; a cathode metal layer disposed on the organic light emitting layer; an encapsulation layer 401 disposed on the cathode metal layer; a driving electrode layer 402 disposed on the encapsulation layer 401; and a circular polarizer plate disposed on the driving electrode layer 402, a sensing electrode layer 403 formed in or at a side of the circular polarizer plate, and the sensing electrode layer 403 and the driving electrode layer 402 formed a touch panel.

The circular polarizer plate includes: a first optical adhesive layer 404 configured to achieve bonding between the circular polarizer plate and the encapsulation layer 401; a quarter phase film 405 disposed on the first optical adhesive layer 404; a second optical adhesive layer 406 disposed on the quarter phase film 405; a first transparent substrate 407 disposed on the second optical adhesive layer 406; a polarizing film 408 disposed on the first transparent substrate 407; and a second transparent substrate 409 disposed on the polarizing film 408.

For example, the sensing electrode layer 402 is disposed on a side of the second transparent substrate 409 away from the polarizing film 408.

In this embodiment, the touch electrode layer is formed on the encapsulation layer 401 and the circular polarizer plate. Therefore, the touch panel does not need to separately manufacture and attach to a display panel, thus save the manufacturing process steps.

Figure 5:
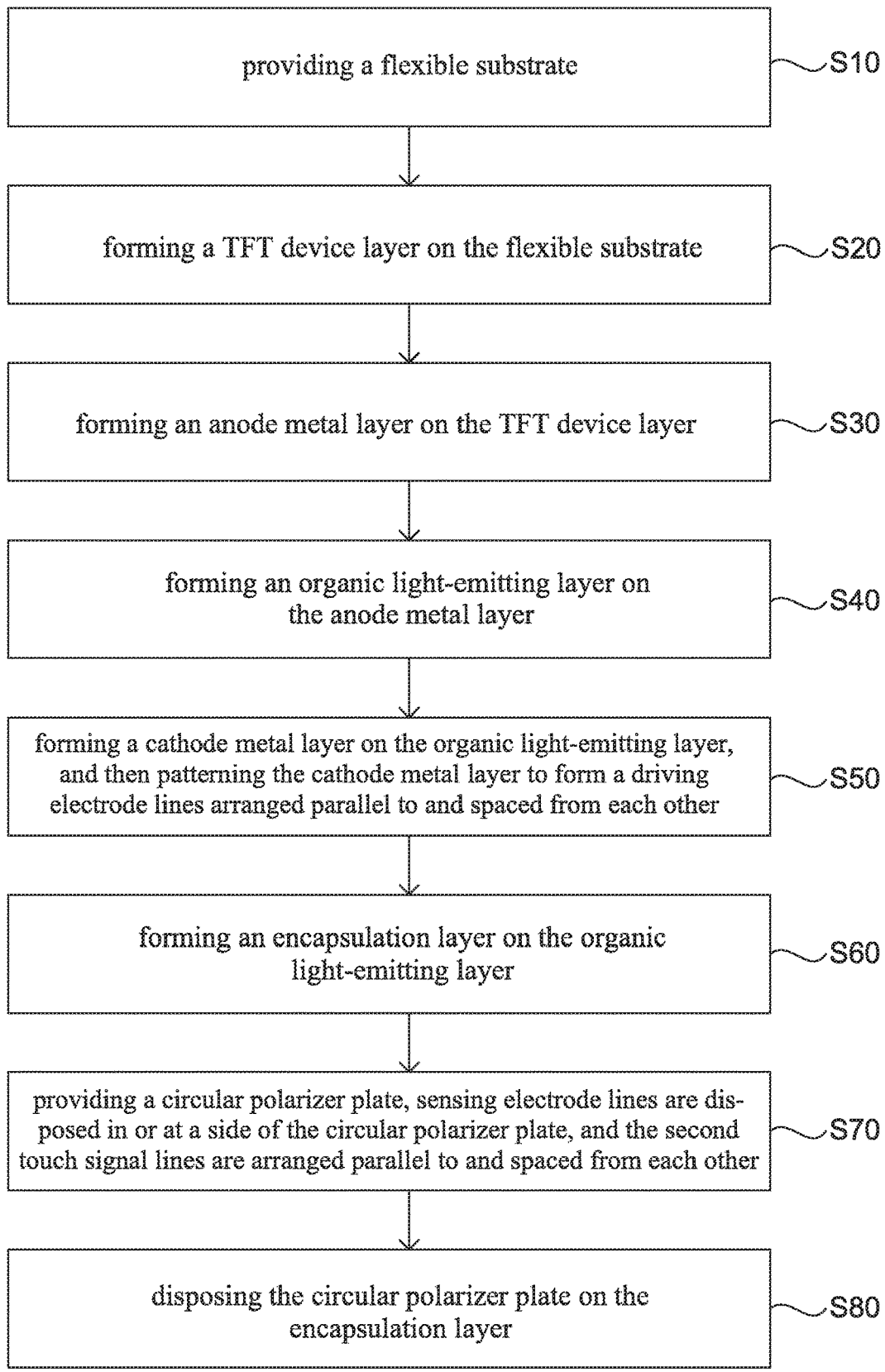
FIG. 5 is a flowchart of a method for manufacturing an OLED touch display panel according to the present invention.

Referring now to FIG. 5, according to the above object of the present invention, the present invention is to provide a method for manufacturing an OLED touch display panel which includes steps:

In a step S10, a flexible substrate is provided;

In a step S20, a thin film transistor device layer is formed on the flexible substrate;

In a step S30, an anode metal layer is formed on the thin film transistor device layer;

In a step S40, an organic light-emitting layer is formed on the anode metal layer;

In a step S50, a cathode metal layer is formed on the organic light-emitting layer, and then the cathode metal layer is patterned to form a driving electrode lines arranged parallel to and spaced from each other;

In a step S60, an encapsulation layer is formed on the organic light-emitting layer;

In a step S70, a circular polarizer plate is provided, a plurality of sensing electrode lines are disposed in or at a side of the circular polarizer plate, and the second touch signal lines are arranged parallel to and spaced from each other; and In a step S80, the circular polarizer plate is disposed on the encapsulation layer.

Compared with conventional OLED touch display panels, the present invention has the advantages of the present invention provides an OLED touch display panel in which a touch electrode is formed on a functional film layer of an OLED display panel, and a cathode metal of an OLED display panel is simultaneously used as a driving electrode of the touch panel, so as to reduces a thickness of the OLED display panel and facilitate to achieve the flexibility, lightening and thinning of OLED display panel, so as to solve conventional technological problems being that a touch panel of an OLED display panel needs to be additionally attached to a surface of the OLED display panel, thus increasing thickness of the OLED display device, resulting in that the flexibility, lightening and thinning of OLED display devices are hard to achieve.

In view of the above, although the present invention has been disclosed by way of preferred embodiments, the above-described preferred embodiments are not intended to limit the present invention, and one of ordinary skill in the art will, without departing from the spirit and scope of the invention, the scope of protection of the present invention is defined by the scope of the claims.

What is claimed is:

1. An organic light-emitting diode (OLED) touch display panel, comprising:
    an array substrate;
    an organic light-emitting layer disposed on the array substrate;
    a cathode metal layer disposed on the organic light-emitting layer, wherein the cathode metal layer is patterned to form first touch signal lines arranged parallel to and spaced from each other;
    an encapsulation layer disposed on the cathode metal layer; and
    a circular polarizer plate disposed on the encapsulation layer,
    wherein second touch signal lines are disposed in or at a side of the circular polarizer plate, the second touch signal lines are arranged parallel to and spaced from each other, and the first touch signal lines and the second touch signal lines are perpendicular to each other and formed on different surfaces, to thus form a touch panel,
    wherein the circular polarizer plate comprises:
    a first optical adhesive layer configured to achieve bonding between the circular polarizer plate and the encapsulation layer;
    a quarter phase film disposed on the first optical adhesive layer;
    a second optical adhesive layer disposed on the quarter phase film;
    a first transparent substrate disposed on the second optical adhesive layer;
    a polarizing film disposed on the first transparent substrate; and
    a second transparent substrate disposed on the polarizing film.

2. The OLED touch display panel according to claim 1, wherein the first touch signal lines are driving electrode lines, and the second touch signal lines are sensing electrode signal lines; and wherein the driving electrode lines are made of indium tin oxide material, the sensing electrode signal lines are formed by a conductive filament made of a metal material or carbon nanotubes, and the metal material is selected from a group consisting of gold, silver, copper, aluminum, titanium, and molybdenum.

3. The OLED touch display panel according to claim 1, wherein the sensing electrode signal lines are disposed on a side of the second transparent substrate away from the polarizing film.

4. The OLED touch display panel according to claim 1, wherein the sensing electrode signal lines are disposed on a side of the quarter phase film away from the second optical adhesive layer.

5. The OLED touch display panel according to claim 1, wherein the sensing electrode signal lines are disposed on a side of the quarter phase film away from the first optical adhesive layer.

6. An organic light-emitting diode (OLED) touch display panel, comprising:
    an array substrate;
    an organic light-emitting layer disposed on the array substrate;
    a cathode metal layer disposed on the organic light-emitting layer;
    an encapsulation layer disposed on the cathode metal layer;
    a circular polarizer plate disposed on the encapsulation layer;
    first touch signal lines; and
    second touch signal lines,
    wherein the first touch signal lines are disposed on the encapsulation layer, and the second touch signal lines are disposed on the first touch signal lines; or wherein the first touch signal lines are disposed on the encapsulation layer, and the second touch signal lines are disposed in or at a side of the circular polarizer plate; or wherein the first touch signal lines are disposed on one side of the circular polarizer plate, and the second touch signal lines are disposed on the other side of the circular polarizer plate or disposed on the first touch signal line, wherein the circular polarizer plate comprises:

a first optical adhesive layer configured to achieve bonding between the circular polarizer plate and the encapsulation layer;

a quarter phase film disposed on the first optical adhesive layer;

a second optical adhesive layer disposed on the quarter phase film;

a first transparent substrate disposed on the second optical adhesive layer;

a polarizing film disposed on the first transparent substrate; and a second transparent substrate disposed on the polarizing film.

7. The OLED touch display panel according to claim 6, wherein the first touch signal lines are driving electrode lines, and the second touch signal lines are sensing electrode signal lines; and wherein the driving electrode lines are made of indium tin oxide material, the sensing electrode signal lines are formed by a conductive filament made of a metal material or carbon nanotubes, and the metal material is selected from a group consisting of gold, silver, copper, aluminum, titanium and molybdenum.

8. A method for manufacturing an organic light-emitting diode (OLED) touch display panel, comprising:

a step S10 of providing a flexible substrate;

a step S20 of forming a thin film transistor device layer on the flexible substrate;

a step S30 of forming an anode metal layer on the thin film transistor device layer;

a step S40 of forming an organic light-emitting layer on the anode metal layer;

a step S50 of forming a cathode metal layer on the organic light-emitting layer, and then patterning the cathode metal layer to form a driving electrode lines arranged parallel to and spaced from each other;

a step S60 of forming an encapsulation layer on the organic light-emitting layer;

a step S70 of providing a circular polarizer plate, wherein sensing electrode lines are disposed in or at a side of the circular polarizer plate, and the second touch signal lines are arranged parallel to and spaced from each other; and a step S80 of disposing the circular polarizer plate on the encapsulation layer;

wherein the circular polarizer plate comprises:

a first optical adhesive layer configured to achieve bonding between the circular polarizer plate and the encapsulation layer;

a quarter phase film disposed on the first optical adhesive layer;

a second optical adhesive layer disposed on the quarter phase film;

a first transparent substrate disposed on the second optical adhesive layer;

a polarizing film disposed on the first transparent substrate; and a second transparent substrate disposed on the polarizing film.

* * * * *